United States Patent
Okawa et al.

(10) Patent No.: US 10,495,988 B2
(45) Date of Patent: Dec. 3, 2019

(54) PRINTING DEVICE AND PRINTING METHOD

(71) Applicant: Panasonic Intellectual Property Management Co., Ltd., Osaka (JP)

(72) Inventors: Koji Okawa, Fukuoka (JP); Yuusuke Morita, Fukuoka (JP); Susumu Toyoda, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/027,429

(22) Filed: Jul. 5, 2018

(65) Prior Publication Data

US 2019/0018327 A1     Jan. 17, 2019

(30) Foreign Application Priority Data

Jul. 14, 2017   (JP) .................. 2017-137575

(51) Int. Cl.
    *G03B 27/52*     (2006.01)
    *G03F 7/20*      (2006.01)
(52) U.S. Cl.
    CPC .............................. *G03F 7/70925* (2013.01)

(58) Field of Classification Search
    CPC .... B41F 15/00; G03F 7/70925; H05K 3/1233
    See application file for complete search history.

(56) References Cited

U.S. PATENT DOCUMENTS

2013/0087057 A1*   4/2013   Kondo ............... H05K 3/1233
                                                         101/123

FOREIGN PATENT DOCUMENTS

JP          7-241977       9/1995

* cited by examiner

*Primary Examiner* — Peter B Kim
(74) *Attorney, Agent, or Firm* — Pearne & Gordon LLP (57) ABSTRACT

Provided is a printing device prints a transfer material onto a substrate via a mask. The printing device includes a placement portion, a moving portion, a cleaning unit, and a control unit. The placement portion is where the mask is movably placed. The moving portion moves the mask placed on the placement portion. The cleaning unit removes the transfer material remaining on the back side of the mask. The control unit controls the moving portion. Upon maintenance of the cleaning unit, the control unit controls the moving portion to move the mask placed on the placement portion to a retract position.

11 Claims, 8 Drawing Sheets

PRINTING DEVICE AND PRINTING METHOD

BACKGROUND

1. Technical Field

The present disclosure relates to a printing device and a printing method for printing a transfer material onto a substrate via a mask having a plurality of openings.

2. Description of the Related Art

A printing device which prints a transfer material such as solder paste onto a substrate via a mask having a plurality of openings will be described. Such a printing device performs mask cleaning by wiping off solder paste remaining on the back side of the mask with cleaning paper mounted on a cleaning unit after a predetermined number of executions of printing on a substrate (for example, refer to Unexamined Japanese Patent Publication No. H07-241977). With the printing device disclosed in Unexamined Japanese Patent Publication No. H07-241977, the cleaning paper in the form of a roll is wound up in the process of repeated execution of the mask cleaning, and eventually there will be no usable portions of the cleaning paper. In this case, an operator pulls out the cleaning unit through a front door located on the front of the device and replaces the cleaning paper by new cleaning paper.

SUMMARY

A printing device according to the present disclosure is a printing device which prints a transfer material onto a substrate via a mask.

The printing device includes a placement portion, a moving portion, a cleaning unit, and a control unit.

The placement portion is where the mask is movably placed.

The moving portion moves the mask placed on the placement portion.

The cleaning unit removes a transfer material remaining on a back side of the mask.

The control unit controls the moving portion.

Upon maintenance of the cleaning unit, the control unit controls the moving portion to move the mask placed on the placement portion to a retract position.

A printing method according to the present disclosure includes:

printing a transfer material onto a substrate via a mask in a print position;

removing, by a cleaning unit, the transfer material remaining on a back side of the mask; and moving the mask from the print position to a retract position upon maintenance of the cleaning unit.

DETAILED DESCRIPTION

In the printing device disclosed in Unexamined Japanese Patent Publication No. H07-241977, the cleaning unit needs to be pulled out through the front of the printing device in order to perform maintenance of the cleaning unit such as replacement of the cleaning paper. Therefore, it is necessary to provide wide work space in front of the printing device. This impedes space-saving efforts of a component mounting line formed by connecting the printing device and a component mounting device.

Hereinafter, one exemplary embodiment of the present disclosure will be described in detail with reference to the drawings. The configurations, shapes, etc., indicated below are examples given for illustrative purposes and can be changed, as appropriate, according to the specifications of the printing device. In all the figures, the same reference marks are given to corresponding elements, and redundant description thereof will be omitted. In the following description, a direction in which a substrate is transported (the horizontal direction in FIG. 1) is referred to as an X direction, a direction orthogonal to the X direction in a horizontal plane (the vertical direction in FIG. 1) is referred to as a Y direction, and a direction orthogonal to the horizontal plane (the vertical direction in FIG. 2) is referred to as a Z direction.

Figure 1:
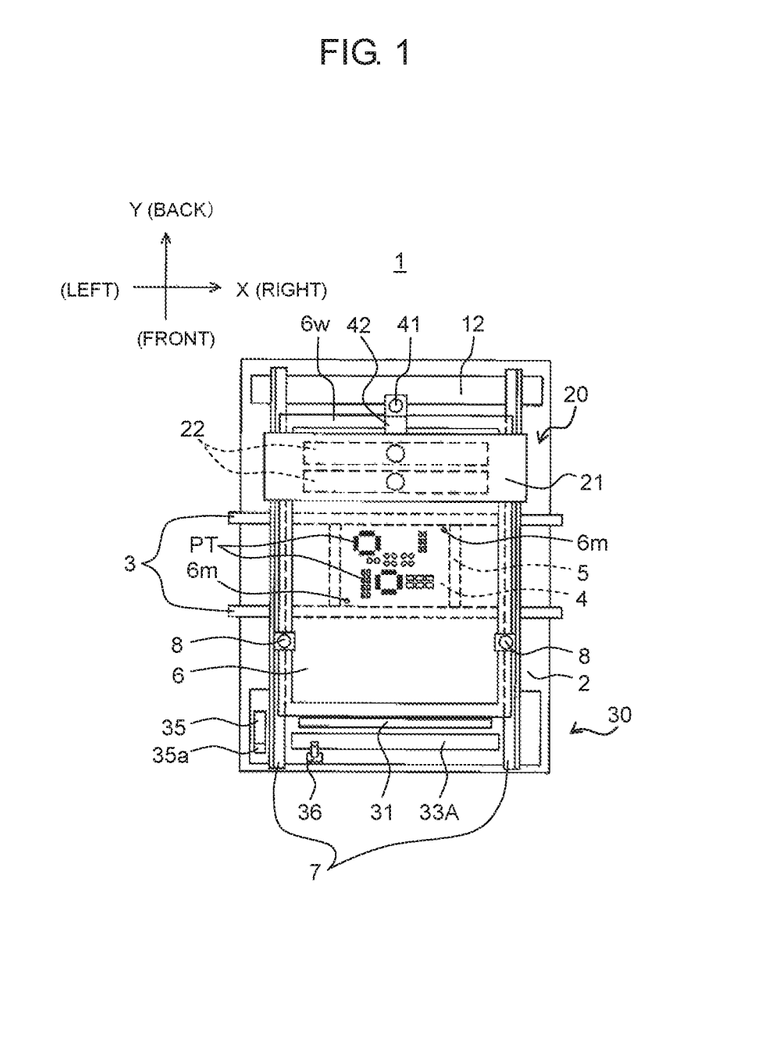
FIG. 1 is a plan view of a printing device according to an exemplary embodiment.
Figure 2:
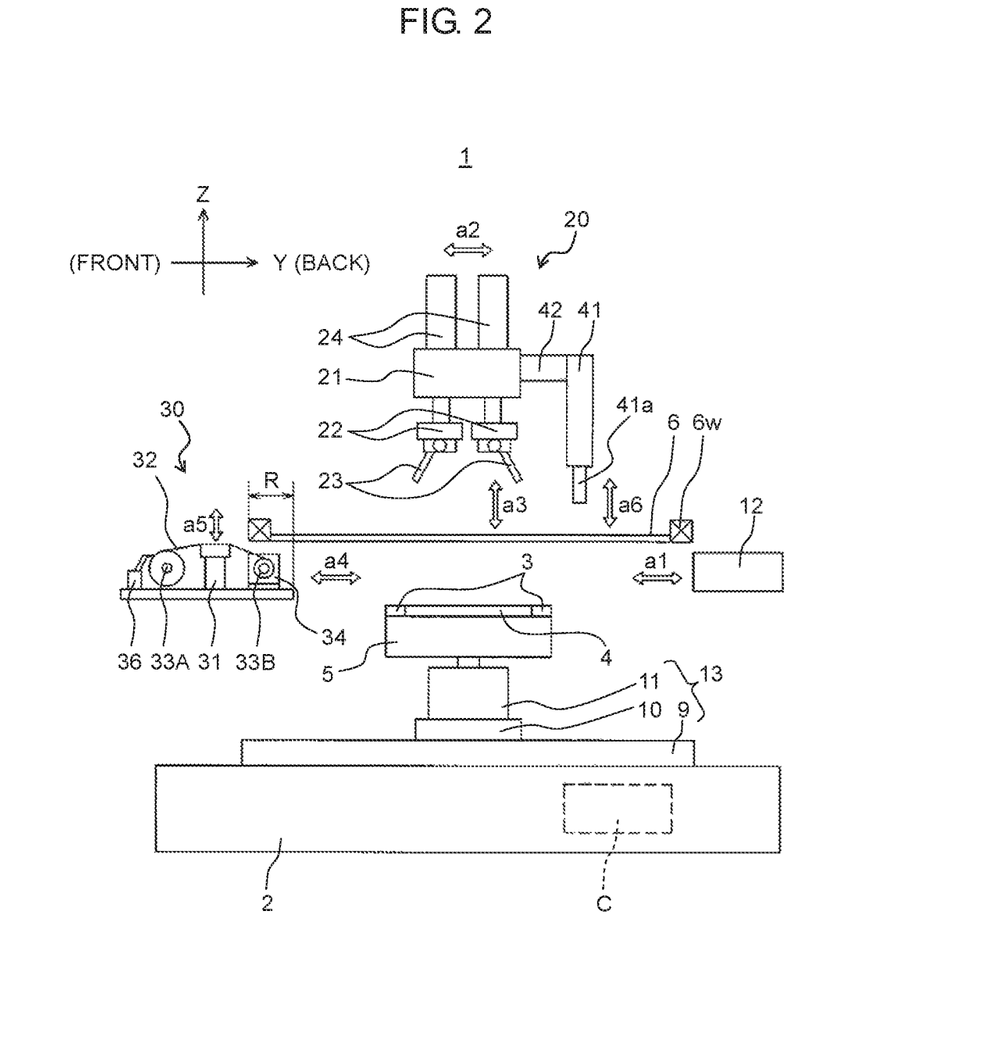
FIG. 2 is a side view of a printing device according to an exemplary embodiment.
Figure 3:
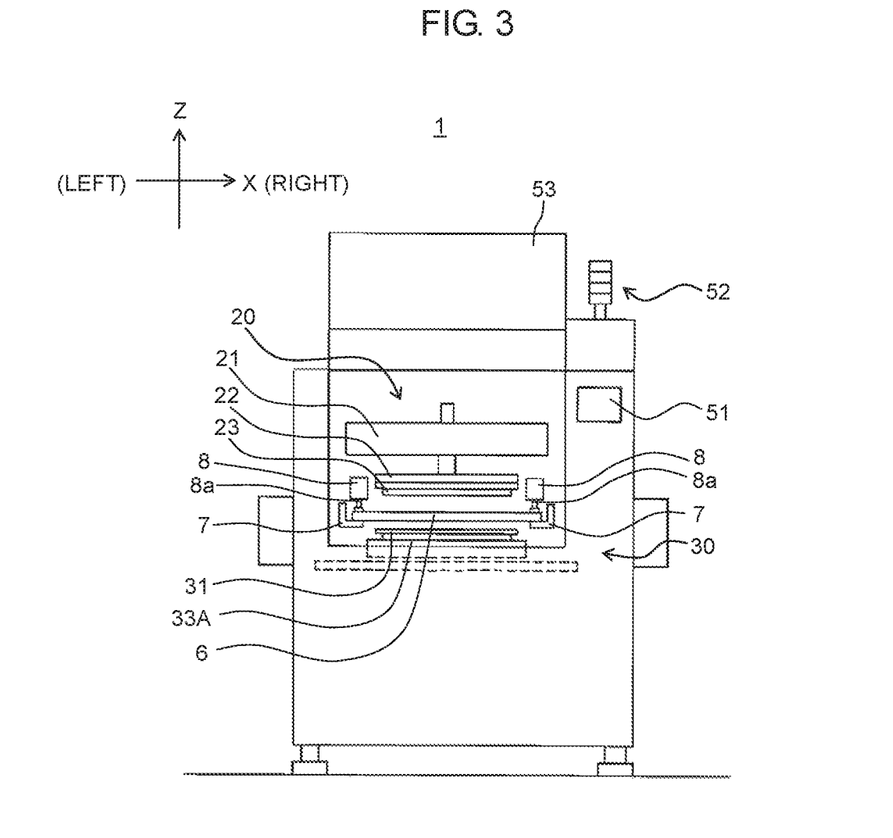
FIG. 3 is a front view of a printing device according to an exemplary embodiment.

First, the structure of printing device 1 will be described with reference to FIG. 1 to FIG. 3. FIG. 1 is a plan view (top view) of printing device 1. FIG. 2 is a side view of printing device 1. FIG. 3 is a front view of printing device 1. Printing device 1 includes a pair of transportation conveyors 3 extending in the X direction above base 2. Control unit C is provided in base 2. Transportation conveyors 3, which are controlled by control unit C, transport, in the X direction, substrate 4 received from an upstream area of printing device 1, thereby transporting substrate 4 toward a downstream area of printing device 1. Substrate holder 5, which is controlled by control unit C, is provided in the vicinity of the center of transportation conveyors 3 in the X direction. Substrate holder 5 receives substrate 4 which transportation conveyors 3 transport and holds substrate 4 in a predetermined clamp position.

Mask 6 having a plurality of openings PT for printing solder paste onto substrate 4 and a pair of mask-end marks 6m is provided above substrate holder 5. Mask 6 has the shape of a rectangular flat plate elongated in the XY plane, and the outer periphery of mask 6 is supported by frame member 6w. Mask 6 is placed on placement portion 7 including a pair of L-shaped rails extending in the Y direction. When mask 6 is placed on placement portion 7, the lower surface of frame member 6w at both ends (left and right ends) of mask 6 in the X direction is supported by the left and right L-shaped rails, and movement of mask 6 in the X direction is restricted by left and right walls which are formed of the pair of L-shaped rails and extend in the Y direction. In this way, placement portion 7 holds mask 6 thereon in such a manner that mask 6 can move in the Y direction.

In FIG. 1 and FIG. 3, two mask clamp cylinders 8, which are controlled by control unit C, are provided above the left and right L-shaped rails of placement portion 7 in each of the front and back areas in the Y direction. Each mask clamp cylinder 8 include mask securing rod 8a having a leading end directed downward and moves mask securing rod 8a in and out of mask clamp cylinder 8 in the Z direction (refer to arrow d1 in FIG. 6A and arrow k1 in FIG. 8B). In the state where mask 6 is placed on placement portion 7, mask clamp cylinders 8 secure the position of mask 6 by projecting mask securing rods 8a downward and sandwiching frame member 6w at the left and right ends of mask 6 between mask securing rods 8a and the left and right L-shaped rails of placement portion 7.

In other words, four mask clamp cylinders 8 serve as a fixture (securing means) which secures mask 6 placed on placement portion 7. Note that the number of mask clamp cylinders 8 is not limited to four. The number of mask clamp cylinders 8 can be freely selected according to the size of mask 6 and other design conditions.

In FIG. 2, XY table 9, θ table 10, and substrate raising and lowering mechanism 11, which are controlled by control unit C, are provided above base 2, in order from the bottom. XY table 9 causes θ table 10 to move in the horizontal plane (in the X direction and the Y direction). θ table 10 causes substrate raising and lowering mechanism 11 to rotate through angle θ about the Z axis. Substrate raising and lowering mechanism 11 supports substrate holder 5 from below and raises and lowers substrate holder 5.

In FIG. 2, camera unit 12 internally including a camera for substrate recognition and a camera for mask recognition is provided in a back area in the Y direction, at a lower level than mask 6. Camera unit 12 moves in the horizontal plane (along arrow a1) by a camera unit moving mechanism (not illustrated in the drawings), which is controlled by control unit C.

With reference to FIG. 2, substrate recognition by camera unit 12 and substrate alignment by XY table 9, θ table 10, and substrate raising and lowering mechanism 11 based on the result of the substrate recognition will be described. At the time of a printing operation to be described later, control unit C moves camera unit 12 to a position between substrate 4 and mask 6. Then, camera unit 12 captures images of a substrate-end mark for positioning, which is formed on substrate 4, and mask-end mark 6m for positioning, which is formed on mask 6 (substrate recognition).

Next, according to the image capture result, control unit C adjusts the position and orientation of substrate 4 by controlling XY table 9, θ table 10, and substrate raising and lowering mechanism 11 so that the plurality of openings PT formed in mask 6 and electrodes formed on substrate 4 held by substrate holder 5 match (substrate alignment). Next, control unit C causes camera unit 12 after the substrate recognition to move to a camera standby position in the back area in the Y direction and causes substrate holder 5 after the substrate alignment to be raised so that substrate 4 is provided under mask 6. In this way, XY table 9, θ table 10, and substrate raising and lowering mechanism 11 serve as substrate positioning mechanism 13 which moves substrate holder 5 provided under mask 6 to align substrate 4 held by substrate holder 5 with mask 6.

Note that even when only one mask-end mark 6m is provided on mask 6, the abovementioned substrate recognition and the abovementioned substrate alignment can be performed. When openings PT of mask 6 and the electrodes formed on substrate 4 are directly matched for positioning of substrate 4, it is not necessary to provide mask-end marks 6m on mask 6.

In FIG. 2, print head 20 which moves in the Y direction by a print head moving mechanism (not illustrated in the drawings) is provided at a higher level than mask 6 (arrow a2). Print head 20 includes moving base 21 which moves in the horizontal plane by the print head moving mechanism. Two squeegee holders 22 are arranged on moving base 21 side by side in the Y direction. Each of squeegee holders 22 holds, at the lower end, squeegee 23 extending in the X direction, and moves up and down by raising and lowering mechanism 24 provided on moving base 21 (arrow a3). The print head moving mechanism and print head 20 are controlled by control unit C.

Figure 5A:
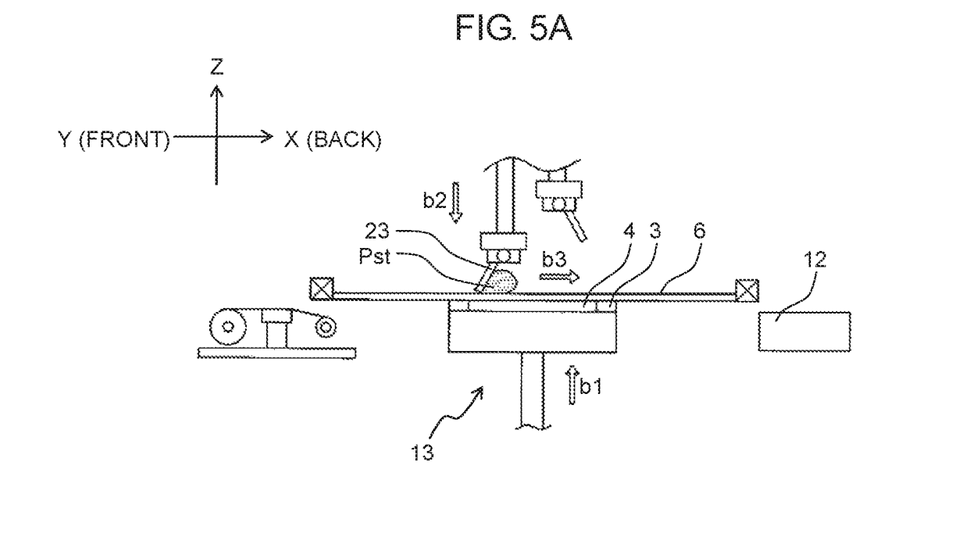
FIG. 5A illustrates a printing step for a printing device according to an exemplary embodiment.

With reference to FIG. 5A, a printing operation for printing solder paste Pst onto substrate 4 via mask 6 will be described. At the time of the printing operation, control unit C causes substrate 4 after the substrate alignment by substrate positioning mechanism 13 to contact mask 6 from below (arrow b1) after the substrate recognition by camera unit 12. Subsequently, control unit C causes raising and lowering mechanism 24 to move down any of squeegees 23, thereby bringing squeegee 23 into abutment with mask 6 (arrow b2). Then, control unit C causes squeegee 23 to slide on the plurality of openings PT of mask 6 in the Y direction (arrow b3). Thus, solder paste Pst is pushed into opening PT of mask 6.

In FIG. 2, cleaning unit 30 which removes solder paste Pst remaining on the back side of mask 6 is provided in a front area in the Y direction, at a lower level than mask 6. Placement portion 7 on which mask 6 is placed is disposed at a higher level than cleaning unit 30 (also refer to FIG. 1). Cleaning unit 30 moves in the Y direction by a cleaning unit moving mechanism (not illustrated in the drawings), which is controlled by control unit C (arrow a4). Cleaning unit 30 includes wiping head 31 which extends in the X direction and moves up and down in the Z direction (arrow a5).

In cleaning unit 30, paper roll 33A, which is wound cleaning paper 32 that has not been used, and paper roll 33B, which is recovered cleaning paper 32 that has been used, are mounted in front and back areas of wiping head 31 in the Y direction. Cleaning paper 32 that has come out of paper roll 33A extends around the upper surface of wiping head 31 and is wound around paper roll 33b rotating by roll rotating mechanism 34, which is controlled by control unit C. In this way, cleaning paper 32 which wipes off solder paste Pst remaining on the back side of mask 6 is mounted in cleaning unit 30.

In FIG. 1, cleaning unit 30 includes cleaning fluid tank 35 which stores cleaning fluid containing a solvent that dissolves solder paste Pst. Furthermore, cleaning unit 30 includes a cleaning fluid applicator (not illustrated in the drawings) which applies the cleaning fluid stored in cleaning fluid tank 35 to cleaning paper 32 which is supplied to wiping head 31. The cleaning fluid applicator is controlled by control unit C.

In FIG. 2, cleaning unit 30 is in standby after having moved to a cleaning unit standby position in the front area in the Y direction, for example, during the printing operation other than a mask cleaning operation. The cleaning unit standby position is set to a position (arrow R) in which a part of cleaning unit 30 that is in standby and a part of mask 60 during the printing operation overlap in plan view (in top view). This allows downsizing of printing device 1 in the Y direction.

Figure 5B:
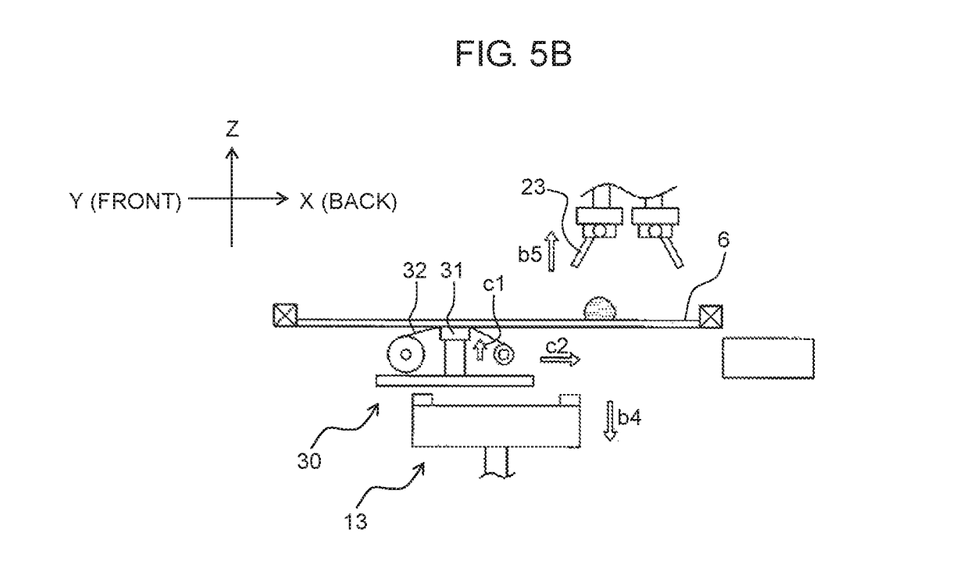
FIG. 5B illustrates a mask cleaning step for a printing device according to an exemplary embodiment.

With reference to FIG. 5B, a mask cleaning operation for removing solder paste Pst remaining on the back side of mask 6 will be described. At the time of the cleaning operation, control unit C moves up wiping head 31, thereby bringing cleaning paper 32 into abutment with the back side of mask 6 (arrow c1). Here, cleaning paper 32 coated with the cleaning fluid extends around the upper surface of wiping head 31. Next, control unit C controls the cleaning unit moving mechanism to move cleaning unit 30 in the Y direction (arrow c2).

Consequently, solder paste Pst remaining on the back side of mask 6 is wiped off with cleaning paper 32. Used cleaning paper 32 that has wiped off solder paste Pst is wound into paper roll 33B, which rotates by roll rotating mechanism 34. Subsequently, unused cleaning paper 32 is supplied onto the upper surface of wiping head 31.

In FIG. 1 and FIG. 2, cleaning unit 30 includes remaining paper amount sensor 36 which measures the diameter of paper roll 33A, which is wound cleaning paper 32 that has not been used. The measurement result of remaining paper amount sensor 36 is transmitted to control unit C, and the remaining amount of cleaning paper 32 that has not been used is calculated. In other words, remaining paper amount sensor 36 is a remaining amount detector (remaining amount detection means) which detects a remaining amount of the usable portion of cleaning paper 32.

Note that the remaining amount detector is not limited to remaining paper amount sensor 36. For example, the remaining amount detector may calculate the remaining amount of unused cleaning paper 32 that is wound into paper roll 33A from the measurement result of a sensor which measures the diameter of paper roll 33B, which is recovered cleaning paper 32 that has been used. Alternatively, the remaining amount detector may cause a counter to store the number of times used cleaning paper 32 has been wound on paper roll 33B so that the remaining amount of unused cleaning paper 32 is calculated from the winding length per winding operation and the winding counts.

Figure 7A:
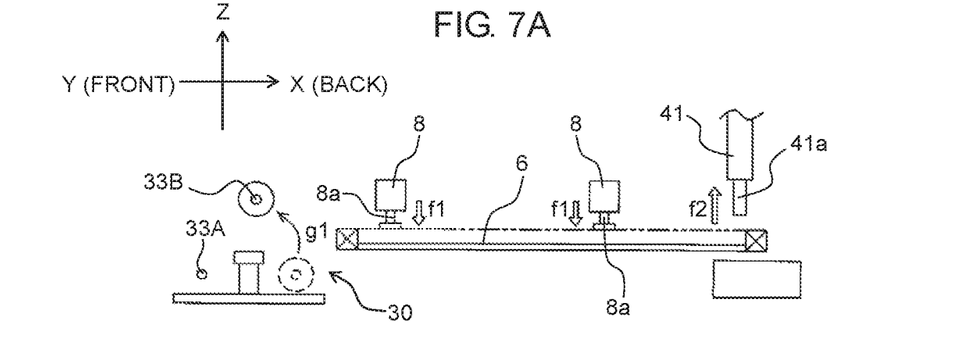
FIG. 7A illustrates a maintenance step for a cleaning unit in a printing device according to an exemplary embodiment.
Figure 7B:
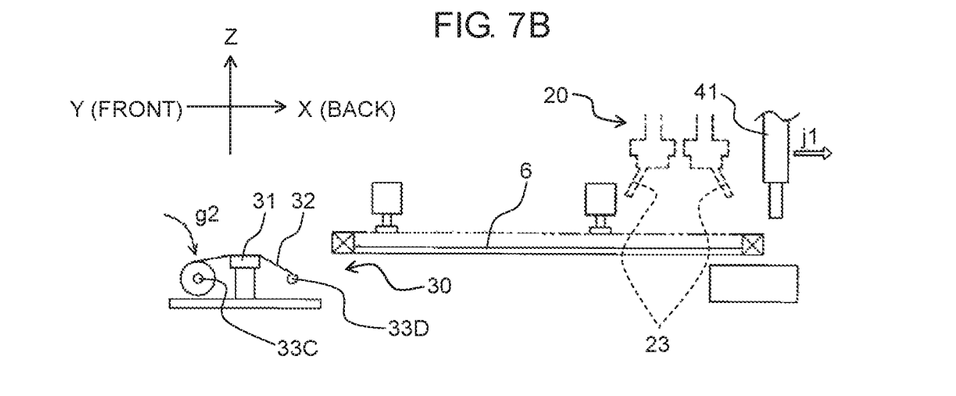
FIG. 7B illustrates a maintenance step for a cleaning unit in a printing device according to an exemplary embodiment.

With reference to FIG. 7A and FIG. 7B, an operation of replacing cleaning paper 32 will be described. When there is no more unused cleaning paper 32 in the process of repeated execution of mask cleaning by cleaning unit 30, a worker performs the operation of replacing cleaning paper 32. In the replacement operation, paper roll 33A that has been depleted and paper roll 33B of recovered cleaning paper 32 that has been used are removed from cleaning unit 30 (arrow g1). Thereafter, new paper roll 33C, which is wound cleaning paper 32 that has not been used, and empty paper roll 33D for recovery are mounted (arrow g2) in such a way that unused cleaning paper 32 extends around the upper surface of wiping head 31.

In FIG. 1, cleaning fluid tank 35 includes remaining cleaning fluid amount sensor 35a which measures a remaining amount of stored cleaning fluid. The measurement result of remaining cleaning fluid amount sensor 35a is transmitted to control unit C, and the remaining amount of cleaning fluid is calculated. When the cleaning fluid in cleaning fluid tank 35 is used up, a worker refills cleaning fluid tank 35 with cleaning fluid. Note that cleaning fluid tank 35 may be replaced for cleaning fluid refilling.

In FIG. 2, mask positioning cylinder 41, which is controlled by control unit C, is provided behind print head 20 in the Y direction. Mask positioning cylinder 41 is connected to moving base 21 by connection member 42 and moves integrally with print head 20 in the Y direction. Mask positioning cylinder 41 includes mask positioning rod 41a having a leading end directed downward and causes mask positioning rod 41a to move in and out of mask positioning cylinder 41 in the Z direction (arrow a6).

When mask positioning cylinder 41 moves in the Y direction in the state where mask positioning rod 41a projects downward, mask positioning rod 41a laterally abuts frame member 6w of mask 6 placed on placement portion 7. By moving mask positioning cylinder 41 further, mask 6 moves on placement portion 7 in the Y direction.

In other words, mask positioning cylinder 41 and the print head moving mechanism are controlled by control unit C and serve as a moving portion (moving means) which moves mask 6 placed on placement portion 7. Note that the moving portion is not limited to this configuration. For example, the moving portion may be configured such that mask positioning cylinder 41 is moved in the Y direction by a moving mechanism independent of a print head moving mechanism which moves print head 20.

Figure 6A:
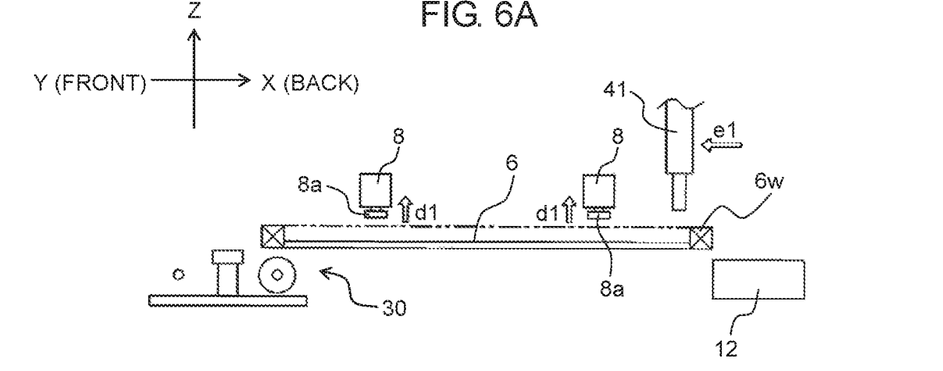
FIG. 6A illustrates a maintenance step for a cleaning unit in a printing device according to an exemplary embodiment.
Figure 6B:
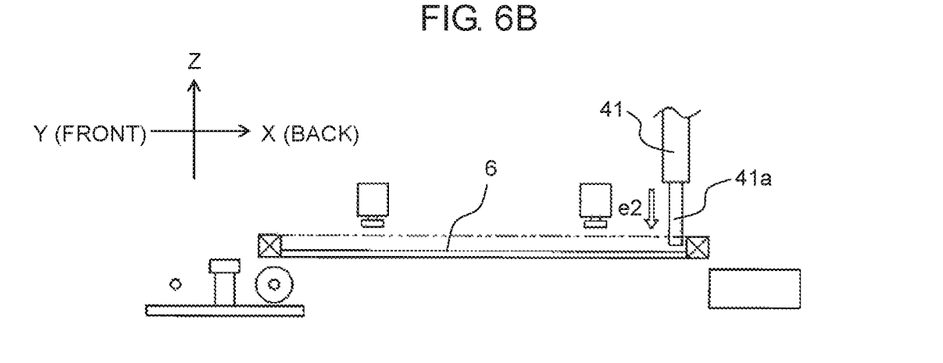
FIG. 6B illustrates a maintenance step for a cleaning unit in a printing device according to an exemplary embodiment.
Figure 6C:
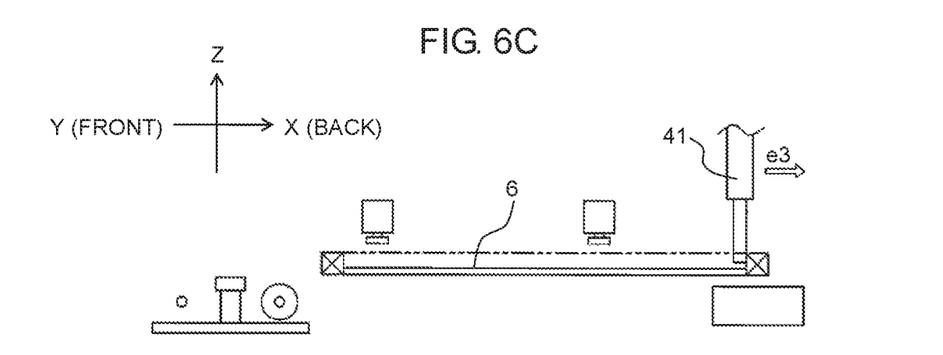
FIG. 6C illustrates a maintenance step for a cleaning unit in a printing device according to an exemplary embodiment.

Control unit C controls the moving portion to move mask 6 placed on placement portion 7 to a retract position in the back area in the Y direction upon maintenance of cleaning unit 30 such as replacement of cleaning paper 32 and cleaning fluid refilling (refer to arrows e1, e2, and e3 in FIG. 6A to FIG. 6C). The retract position of mask 6 is where mask 6 does not hinder replacement of cleaning paper 32 and cleaning fluid refilling which are conducted by a worker. Plausible examples of the retract position in which mask 6 does not hinder the replacement and the refilling include a position in which mask 6 does not overlap cleaning unit 30 in plan view (in top view) of printing device 1. Note that mask 6 in the retract position may partially overlap cleaning unit 30 unless the replacement and the refilling are hindered.

Figure 7C:
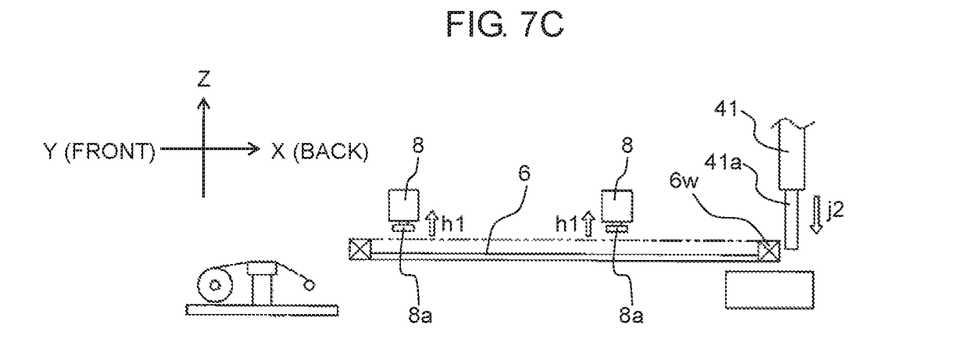
FIG. 7C illustrates a maintenance step for a cleaning unit in a printing device according to an exemplary embodiment.
Figure 8A:
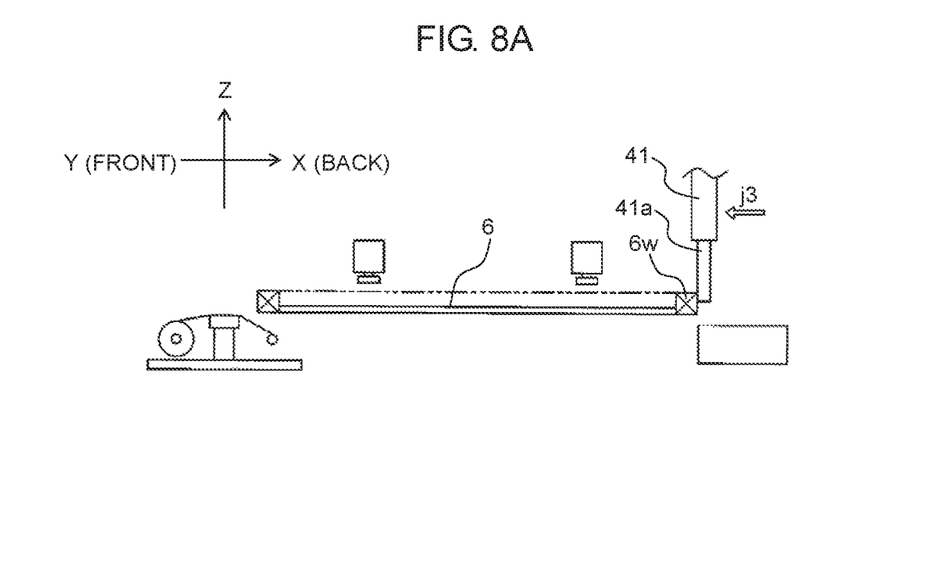
FIG. 8A illustrates a maintenance step for a cleaning unit in a printing device according to an exemplary embodiment.
Figure 8B:
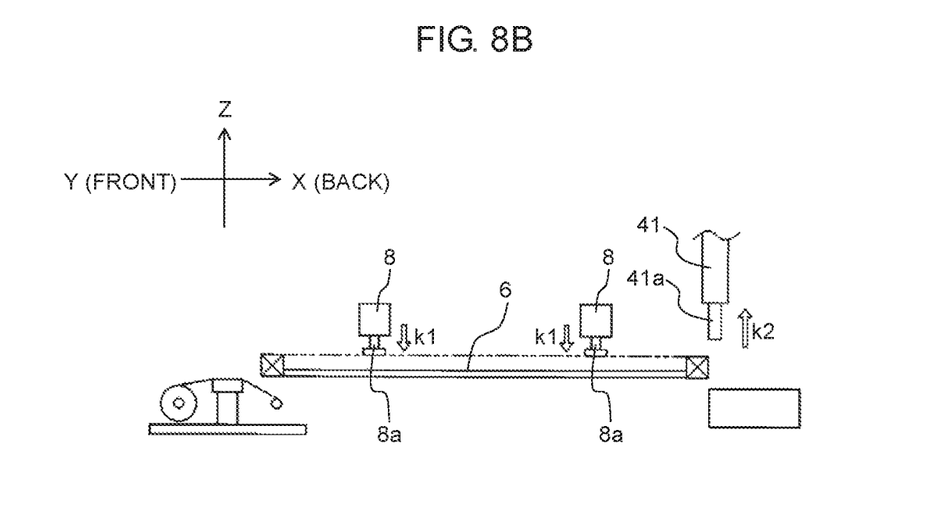
FIG. 8B illustrates a maintenance step for a cleaning unit in a printing device according to an exemplary embodiment.

Furthermore, upon the printing operation, control unit C controls the moving portion to move mask 6 placed on placement portion 7 to a print position in the front area in the Y direction (refer to arrows j1, j2, and j3 in FIG. 7B, FIG. 7C, and FIG. 8A). The print position of mask 6 is where at least a part of mask 6 placed on placement portion 7 overlaps a part of cleaning unit 30 in plan view (in top view).

In FIG. 3, touch panel 51 is provided at the top right of the front of printing device 1 which a worker operates. Touch panel 51 is connected to control unit C and includes: a function of displaying not only various data and a control screen, but also the operating status, etc., of printing device 1, on a liquid-crystal panel; and a function of inputting an operation command, data, and so on. Notification light 52 formed by stacking a plurality of lamps is provided in the right area of the upper surface of printing device 1. Notification light 52 is connected to control unit C, which turns on the lamps according to the operating status of printing device 1.

When control unit C detects, according to the measurement result of remaining paper amount sensor 36, that there is no more paper roll 33A, which is wound cleaning paper 32 that has not been used, control unit C causes touch panel 51 to display such fact or turns on a predetermined lamp of notification light 52, for example, to indicate replacement of cleaning paper 32. In other words, touch panel 51 and notification light 52 serve as a notifier which indicates replacement of cleaning paper 32. Then, when the remaining amount detector (remaining paper amount sensor 36) detects that there is no more usable portion of cleaning paper 32, the notifier indicates replacement of cleaning paper 32.

Furthermore, when control unit C detects, according to the measurement result of remaining cleaning fluid amount sensor 35a, that there is no more cleaning fluid in cleaning fluid tank 35, control unit C causes the notifier to indicate cleaning fluid refilling. Note that the notifier is not limited to touch panel 51 and notification light 52. As long as the notifier can notify a worker of maintenance of cleaning unit 30, the notifier may be a buzzer which produces a sound for notification or may be a mobile terminal which is to be carried by the worker.

In FIG. 3, work door 53 is provided in an upper area of the front of printing device 1. Work door 53 is closed while printing device 1 is automatically operating such as during the printing operation. A worker opens work door 53 when the worker needs to access the interior of printing device 1 such as upon maintenance of cleaning unit 30 including replacement of cleaning paper 32, replacement of mask 6, and solder paste Pst refilling. FIG. 3 illustrates the state where work door 53 is open.

Figure 4:
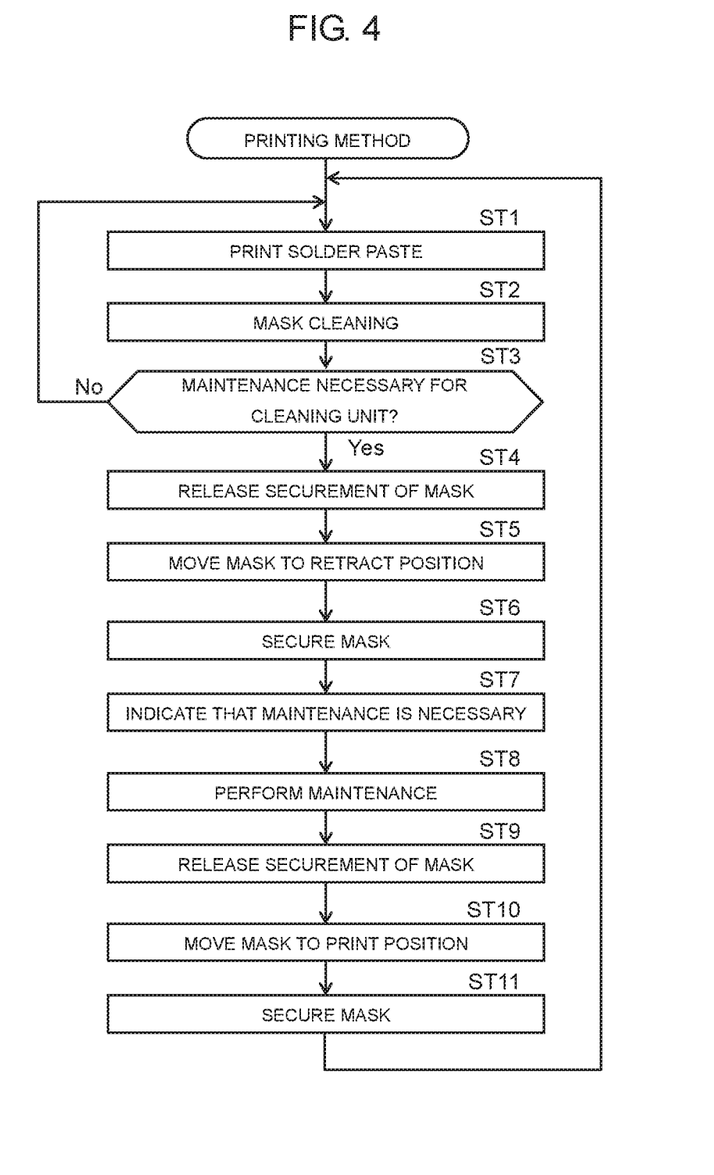
FIG. 4 is a flowchart of a printing method for a printing device according to an exemplary embodiment.

Next, in line with the flow in FIG. 4, a printing method for printing solder paste Pst onto substrate 4 via mask 6 having the plurality of openings PT will be described with reference to FIG. 5 to FIG. 8. Assume that in printing device 1, mask 6 is secured in the print position by mask clamp cylinder 8. In FIG. 4, first, solder paste Pst is printed onto substrate 4 (ST1: printing step).

More specifically, in FIG. 5A, substrate positioning mechanism 13 holds substrate 4 carried in by transportation conveyors 3, camera unit 12 performs the substrate recognition, and substrate positioning mechanism 13 performs the substrate alignment. Subsequently, substrate 4 is moved up (arrow b1) and brought into abutment with the back side of mask 6 secured in the print position. Thereafter, squeegee 23 is moved down (arrow b2), brought into abutment with mask 6, and slid in the Y direction (arrow b3); thus, solder paste Pst is pushed into opening PT of mask 6.

In FIG. 5B, substrate 4 is then moved down (arrow b4) and snapped off mask 6. Thus, solder paste Pst is transferred (printed) onto substrate 4. Subsequently, printed substrate 4 is carried out by transportation conveyors 3, and squeegee 23 is moved up (arrow b5). In this way, the sequence of the printing step (ST1) for one substrate 4 is completed.

In FIG. 4, cleaning unit 30 subsequently removes solder paste Pst remaining on the back side of mask 6 (ST2: mask cleaning step). More specifically, in FIG. 5B, wiping head 31 is moved up under mask 6, bringing cleaning paper 32 into abutment with the back side of mask 6 (arrow c1). Then, cleaning unit 30 is moved in the Y direction (arrow c2), and solder paste Pst remaining on the back side of mask 6 is wiped off with cleaning paper 32. Cleaning unit 30 after the mask cleaning moves to the cleaning unit standby position.

In this way, the sequence of the mask cleaning step (ST2) is completed. Note that the mask cleaning step (ST2) does not need to be performed every time solder paste Pst is printed onto single substrate 4, but may be performed after completion of printing onto a predetermined number of substrates 4.

In FIG. 4, control unit C subsequently determines whether or not cleaning unit 30 needs maintenance (ST3: maintenance determination step), for example, due to there being no more usable portion of cleaning paper 32 or no more cleaning fluid. When the maintenance is not necessary (No in ST3), the printing step (ST1) and the mask cleaning step (ST2) in the next cycle are performed. When the maintenance is necessary (Yes in ST4), the following maintenance work is performed.

Mask clamp cylinder 8 moves up mask securing rod 8a (arrow d1 in FIG. 6A), releasing securement of mask 6 (ST4). Next, the moving portion moves mask 6 located in the print position to the retract position (ST5: retracting step). More specifically, mask positioning cylinder 41 moves to a position in front of frame member 6w in the back area of mask 6 (arrow e1 in FIG. 6A) and projects mask positioning rod 41a downward (arrow e2 in FIG. 6B). Subsequently, mask positioning cylinder 41 moves backward (arrow e3 in FIG. 6C), causing mask 6 to move to the retract position.

In FIG. 4, subsequently, when mask 6 moves to the retract position, mask clamp cylinder 8 moves down mask securing rod 8a (arrow f1 in FIG. 7A), securing mask 6 (ST6). Thus, it is possible to prevent a worker from moving or removing mask 6 by accident during the maintenance work. When mask 6 is secured, mask positioning cylinder 41 pulls up mask positioning rod 41a (arrow f2 in FIG. 7A). In this way, the moving portion moves mask 6 to the retract position upon maintenance of cleaning unit 30. Thus, mask 6 and cleaning unit 30 do not interfere with each other, allowing a worker to perform the maintenance of cleaning unit 30 with work door 53 open.

In FIG. 4, control unit C sequentially causes the notifier (touch panel 51 and notification light 52) to indicate that maintenance of cleaning unit 30 is necessary (ST7: notification step). Specifically, when there is no more usable portion of cleaning paper 32, replacement of cleaning paper 32 is indicated. When there is no more cleaning fluid, cleaning fluid refilling is indicated. In this way, a worker can know that printing device 1 needs maintenance on cleaning unit 30. Note that the notification step (ST7) may be performed at the point in time when it is found that maintenance of cleaning unit 30 will soon become necessary in light of there being a small usable portion of cleaning paper 32 or a small amount of the cleaning fluid left.

Next, the worker who has been notified performs the maintenance work (ST8). Upon replacement of cleaning paper 32, the worker removes empty paper roll 33A and paper roll 33B, which is wound cleaning paper 32 that has been used, from cleaning unit 30 (arrow g1 in FIG. 7A). Next, the worker mounts empty paper roll 33d for recovery and new paper roll 33C, which is wound cleaning paper 32 that has not been used, in cleaning unit 30 (arrow g2 in FIG. 7B), in such a way that unused cleaning paper 32 extends around the upper surface of wiping head 31. When the maintenance work is completed, the worker operates touch panel 51 to report the completion of the work.

In FIG. 4, when the completion of the maintenance work is reported, mask clamp cylinder 8 moves up mask securing rod 8a (arrow h1 in FIG. 7C), releasing securement of mask 6 (ST9). Next, the moving portion moves mask 6 located in the retract position to the print position (ST10: print position moving step).

More specifically, mask positioning cylinder 41 moves to a position behind frame member 6w in the back area of mask 6 (arrow j1 in FIG. 7B) and projects mask positioning rod 41a downward (arrow j2 in FIG. 7C). Note that print head 20 is configured so that even when mask positioning cylinder 41 is located behind frame member 6w in the back area of mask 6, squeegee 23 is located above mask 6 (refer to FIG. 7B). With this, it is possible to prevent solder paste Pst attached to squeegee 23 from falling outside mask 6 during the maintenance work.

Next, mask positioning cylinder 41 moves forward (arrow j3 in FIG. 8A), moving mask 6 to the print position. In other words, when the maintenance work on cleaning unit 30 such as replacement of cleaning paper 32 and cleaning fluid refilling is completed, mask 6 located in the retract position moves to the print position.

In FIG. 4, subsequently, when mask 6 moves to the print position, mask clamp cylinder 8 moves down mask securing rod 8a (arrow k1 in FIG. 8B), securing mask 6 (ST11). Thus, mask 6 in the printing operation is secured. When mask 6 is secured, mask positioning cylinder 41 pulls up mask positioning rod 41a (arrow k2 in FIG. 8B). This allows print head 20 to move without mask positioning rod 41a interfering with mask 6. Then, the processing returns to the printing operation, and the printing step (ST1) and the mask cleaning step (ST2) in the next cycle are performed.

As described above, printing device 1 according to the present exemplary embodiment includes: placement portion 7 on which the mask 6 is movably placed; a moving portion (mask positioning cylinder 41 and the print head moving mechanism) which moves mask 6 placed on placement portion 7; cleaning unit 30 which removes solder paste Pst remaining on the back side of mask 6; and control unit C which controls the moving portion. Upon maintenance of cleaning unit 30, mask 6 placed on placement portion 7 is moved to the retract position.

With this, mask 6 inside printing device 1 does not hinder the maintenance work on cleaning unit 30, and thus the maintenance of cleaning unit 30 is facilitated. Furthermore, no extra work space for maintenance of cleaning unit 30 needs to be provided around printing device 1, and thus the footprint of printing device 1 can be reduced.

Note that although the above exemplary embodiment illustrates an example in which solder paste Pst is used as the transfer material, resin paste used as an adhesive for bonding a component to the substrate can be used as the transfer material. Other materials in paste form can also be used as the transfer material.

According to the present disclosure, it is possible to provide a printing device which requires a small footprint and in which maintenance of a cleaning unit is easy.

The printing device and the printing method according to the present disclosure produce advantageous effects of facilitating maintenance of a cleaning unit and reducing the footprint, and thus are useful in the technical field of mounting a component onto a substrate.

What is claimed is:

1. A printing device which prints a transfer material onto a substrate via a mask, the printing device comprising:
 a placement portion on which the mask is movably placed;
 a moving portion which moves the mask placed on the placement portion;
 a cleaning unit which removes the transfer material remaining on aback side of the mask; and
 a control unit which controls the moving portion, wherein upon maintenance of the cleaning unit, the control unit controls the moving portion to move the mask placed on the placement portion to a retract position,
 wherein the printing device further comprises a fixture which secures the mask placed on the placement portion,
 wherein the control unit controls the fixture to secure the mask that has moved to the retract position, and
 wherein the fixture is vertically movable between a position of securing the mask and a position of releasing the mask from being secured.

2. The printing device according to claim 1, wherein
 the placement portion is disposed at a higher level than the cleaning unit, and
 during printing, at least a part of the mask placed on the placement portion overlaps a part of the cleaning unit in top view.

3. The printing device according to claim 1, wherein
 in the cleaning unit, cleaning paper which wipes off the transfer material remaining on the back side of the mask is mountable, and
 the retract position is where the mask does not hinder replacement of the cleaning paper.

4. The printing device according to claim 3, further comprising:
 a remaining amount detector which detects a remaining amount of a usable portion of the cleaning paper; and
 a notifier which indicates replacement of the cleaning paper, wherein
 when the remaining amount detector detects that there is no more usable portion of the cleaning paper, the notifier indicates the replacement of the cleaning paper.

5. The printing device according to claim 3, wherein
 the mask in the retract position does not overlap the cleaning unit in top view.

6. A printing method comprising:
 securing a mask on a substrate at a print position with a fixture;
 printing a transfer material onto the substrate via the mask in the print position;
 removing, by a cleaning unit, the transfer material remaining on a back side of the mask;
 releasing the mask from being secured by vertically moving the fixture upwardly;
 moving the mask from the print position to a retract position upon maintenance of the cleaning unit; and
 securing the mask at the retract position with the fixture after the mask moves to the retract position.

7. The printing method according to claim 6, wherein
 the mask is disposed at a higher level than the cleaning unit, and at least a part of the mask overlaps a part of the cleaning unit in top view.

8. The printing method according to claim 6, wherein
 in the cleaning unit, cleaning paper which wipes off the transfer material remaining on the back side of the mask is mountable, and
 the retract position is where the mask does not hinder replacement of the cleaning paper.

9. The printing method according to claim 8, further comprising:
 indicating replacement of the cleaning paper when there is no more usable portion of the cleaning paper.

10. The printing method according to claim 8, wherein
 the mask in the retract position does not overlap the cleaning unit in top view.

11. The printing method according to claim 6, further comprising:
 moving the mask from the retract position to the print position when the maintenance of the cleaning unit is completed.

* * * * *